United States Patent [19]

Casto

[11] Patent Number: 5,147,815
[45] Date of Patent: Sep. 15, 1992

[54] METHOD FOR FABRICATING A MULTICHIP SEMICONDUCTOR DEVICE HAVING TWO INTERDIGITATED LEADFRAMES

[75] Inventor: James J. Casto, Austin, Tex.

[73] Assignee: Motorola, Inc., Schaumburg, Ill.

[21] Appl. No.: 663,223

[22] Filed: Mar. 1, 1991

Related U.S. Application Data

[63] Continuation of Ser. No. 552,759, May 14, 1990, abandoned.

[51] Int. Cl.⁵ .................... H01L 21/56; H01L 21/58; H01L 21/60
[52] U.S. Cl. ........................... 437/51; 437/206; 437/207; 437/208; 437/217; 437/220
[58] Field of Search ............... 357/70, 75; 437/206, 437/207, 208, 217, 220, 51; 174/52.4; 29/827

[56] References Cited

U.S. PATENT DOCUMENTS

| | | | |
|---|---|---|---|
| 3,808,673 | 5/1974 | Bottini | 437/211 |
| 4,437,235 | 3/1984 | McIver | 174/52.4 |
| 4,496,965 | 1/1985 | Orcutt et al. | 357/81 |
| 4,677,526 | 6/1987 | Muehling | 357/81 |
| 4,755,474 | 7/1988 | Moyer | 357/70 |
| 4,763,188 | 8/1988 | Johnson | 357/75 |
| 4,796,078 | 1/1989 | Phelps, Jr. et al. | 357/70 |
| 4,801,765 | 1/1989 | Moyer et al. | 29/827 |

FOREIGN PATENT DOCUMENTS

| | | | |
|---|---|---|---|
| 0397320A | 11/1990 | European Pat. Off. | |
| 0062350 | 5/1981 | Japan | 357/70 |
| 0062351 | 5/1981 | Japan | 357/70 |
| 1-303730 | 12/1989 | Japan | 437/208 |
| 1-304757 | 12/1989 | Japan | 437/220 |

*Primary Examiner*—Robert Kunemund
*Assistant Examiner*—David E. Graybill
*Attorney, Agent, or Firm*—Patricia S. Goddard

[57] ABSTRACT

A packaged semiconductor device is disclosed having at least two electronic components encapsulated in a single body of standard size and pin-out configuration. In accordance with one embodiment of this invention, two leadframes, having electronic components electrically coupled thereto, are positioned such that the electronic components are in a stacked relationship and the outer portions of the two sets of leads within each leadframe are interdigitated. The configuration enables all components to be accessed independently and minimizes the footprint of the device while maintaining a standard package outline.

12 Claims, 5 Drawing Sheets

METHOD FOR FABRICATING A MULTICHIP SEMICONDUCTOR DEVICE HAVING TWO INTERDIGITATED LEADFRAMES

This application is a continuation of prior application Ser. No. 07/552,759, filed May 14, 1990 now abandoned.

RELATED APPLICATION

This application is related to commonly assigned McShane, et al, Ser. No. 474,885 filed Feb. 5, 1990, now abandoned.

BACKGROUD OF THE INVENTION

This invention relates in general to the fabrication of semiconductor devices and more particularly to the encapsulation of multiple semiconductor components into a single package.

Semiconductor devices are basically comprised of a semiconductor die which is electrically coupled to a leadframe having numerous leads. The die and portions of the leadframe are encapsulated in a protective body such that the outer portions of the leads are exposed. This unit eventually becomes part of yet another assembly such as a PC (printed circuit) board or other substrate material with numerous such semiconductor devices upon it.

Integration levels of electronic components on PC boards are continually increasing while the space available for semiconductor devices remains the same, or even grows smaller. For this reason, semiconductor manufacturers are continually striving to make their devices smaller and denser in an effort to better utilize the space that is available on a PC board.

In the past, common ways to achieve smaller, denser devices included shrinking the semiconductor die or redesigning the die in order to use its area more effectively, thus reducing the package size required. More recently, the concept of multichip components has become increasingly popular. This idea enables the manufacturer to assemble two or more semiconductor die in a single package. Multichip components not only reduce the space required on the substrate material, but also have the advantages of reducing the total cost of materials, reducing handling and operational costs, and reducing the distance between chips, thus reducing transmission times.

Unfortunately, many multichip module features differ widely from those of standard semiconductor packages, thereby requiring the user to make significant layout changes in the substrate. Other designs offer more flexibility to the device user; however, these may require modifications to existing package designs or changes in the layout of the circuitry of the device. Another limiting factor to some multichip module designs is that while the chips are put into a single package, the space occupied by that package on the substrate material, also known as the footprint, is not minimized.

A need therefore existed for an improved semiconductor device, more specifically for an improved semiconductor device encapsulated in a multichip package, which would increase functionality of a semiconductor device while keeping the associated substrate material or PC board space to a minimum and which would require minimal modifications to existing materials and processes for device assembly and for mounting the device to substrate material.

It is therefore an object of this invention to provide an improved semiconductor device which provides the user with the functionality of two or more chips, while keeping the space the device occupies on a substrate to a minimum.

It is another object of this invention to provide an improved multichip semiconductor device which maintains the existing standard outline package and pin-out configurations.

It is yet another object of this invention to provide a fabrication method for such improved semiconductor devices which requires minimal modifications to existing assembly processes.

BRIEF SUMMARY OF THE INVENTION

The foregoing and other objects and advantages of the invention are achieved by encapsulating two semiconductor die, one above the other, in one package, such that the die may function either together or independently via electrical connections to two separate leadframes. The two leadframes exit the package body in a single plane having their leads interdigitated, thus appearing as a standard package with a single leadframe to the semiconductor device user. One embodiment of the invention includes electrically coupling first and second semiconductor die to first and second leadframes with first and second plurality of leads, respectively. The leadframe with the first die attached is positioned above the second leadframe with the second die attached such that the first and second die are in a stacked relationship and such that the outer portions of the first and second plurality of leads are interdigitated. The first and second die and inner portions of the first and second leadframe are encapsulated in a protective body member, from which the interdigitated outer portions of the first and second plurality of leads extend in a single plane.

BRIEF DESCRIPTION OF DRAWINGS

FIG. 4 (A & B) illustrate the alignment of two leadframes in accordance with the invention, such that the outer portions of their respective leads are interdigitated;

DETAILED DESCRIPTION OF INVENTION

In one embodiment, the present invention is a packaged semiconductor device containing at least two electronic components in a single body member which has a substantially standard package outline and pin-out configuration. The components, which can include integrated circuits (ICs), discrete devices, and the like, are accessed independently by the use of two leadframes each having a plurality of leads. Each component, also referred to as a "die," is electrically coupled to the leads of one of the leadframes by wire bonds or TAB (Tape Automated Bonding) bonds. The leadframes are positioned together so that the die are stacked, one above the other, and the outer portions of the leads are interdigitated. This sub-assembly is encapsulated in a protective body member from which extend the outer portions of the interdigitated leads in a single plane, appearing as a single leadframe on the exterior of the package. Thus, the user has the functionality of two or more components in a single, standard package which occupies less space on the user's substrate material than having the components packaged individually.

Figure 1:
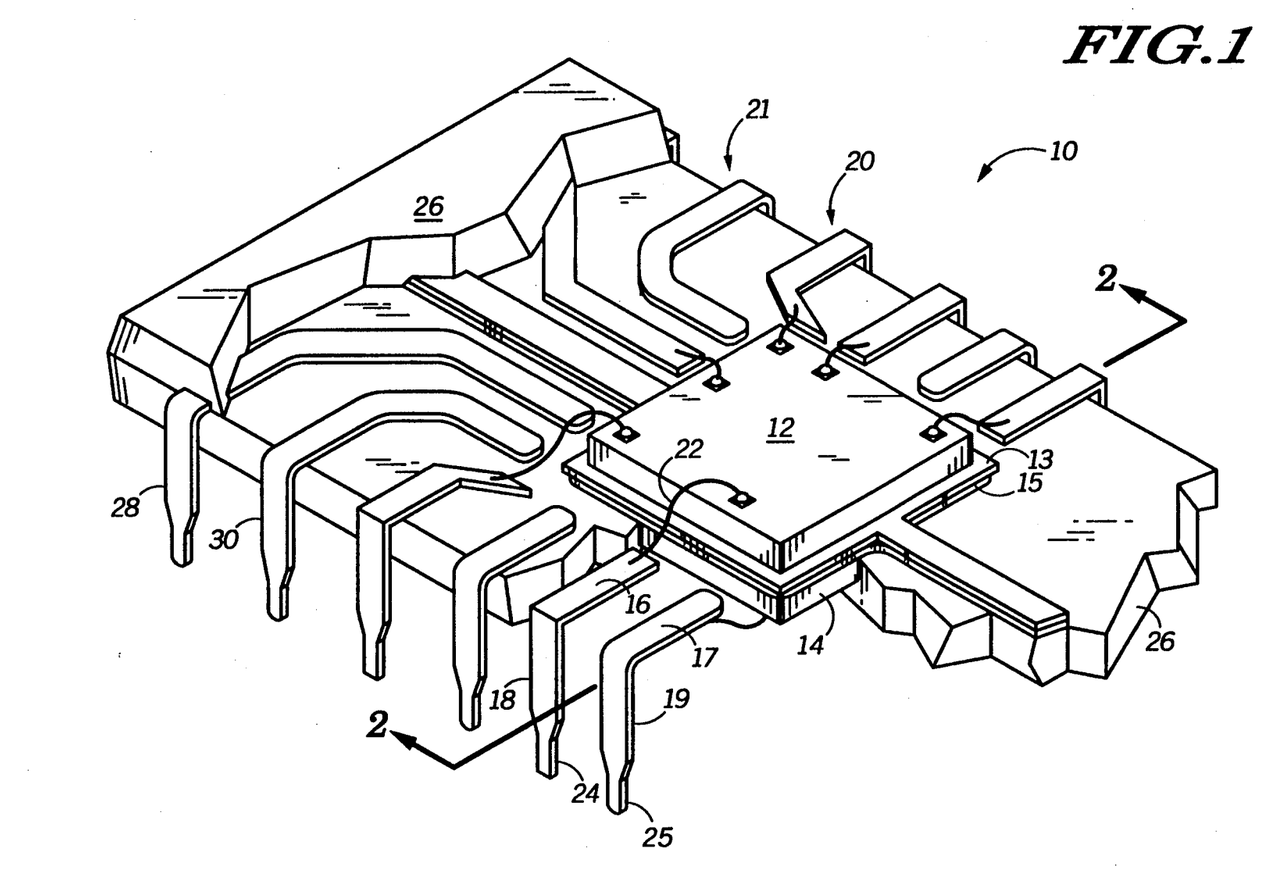
FIG. 1 is a cut-away perspective view of a packaged semiconductor device illustrating one preferred embodiment of the invention incorporating two semiconductor die on two separate leadframes in which the die are electrically coupled to the leadframes using wire bonds.

FIG. 1 illustrates one preferred embodiment of this invention. The packaged semiconductor device 10 includes two semiconductor die 12 and 14. Although more than two die can be included in device 10, further descriptions will be limited to only two components for clarity of illustration. Die 12 and 14 are shown mounted to flags 13 and 15, respectively. Flags 13 and 15 act as support structures for the die and are part of leadframes 20 and 21. (Leadframes 20 and 21 are differentiated, for purposes of illustration only, by the rounded corners and edges of leadframe 21 and the sharp corners and edges of leadframe 20.) Die 12 and 14 are mounted to flags 13 and 15 using an adhesive material such as epoxy, solder, polyimide, conductive glass or the like. Semiconductor die 12 is electrically coupled to the inner portions 16 of leads 18 of leadframe 20 and die 14 is electrically coupled to the inner portions 17 of leads 19 of leadframe 21. The electrical coupling shown in FIG. 1 is accomplished with wire bonds 22. Other methods of coupling, such as TAB bonding or the like, may also be used. The number of bonds and leads depicted is not necessarily indicative of the number of bonds and leads of a semiconductor device, but is used to illustrate the invention clearly.

As further illustrated in FIG. 1, the outer portions 24 of leads 18 of leadframe 20 are interspersed or interdigitated among the outer portions 25 of leads 19 of leadframe 21. In the context of this application, interdigitated implies that the leads of one leadframe appear mixed with the leads of the other leadframe. The leads of one leadframe need not appear alternately next to the leads of the other leadframe on the exterior of the package. For example, leads 28 and 30 of leadframe 21 are not separated by a lead from leadframe 20. Consequently, the number of leads in leadframe 20 may be larger or smaller than the number of leads in leadframe 21, depending on the pin-out requirements of die 12 and 14. FIG. 1 also illustrates, in accordance with this invention, that the outer portions 24 and 25 of leadframes 20 and 21, respectively, exit the body member 26 in a single plane. The leads 18 and 19 of the semiconductor device 10 extend from the package 26 in a standard dual in-line configuration suitable for through-hole mounting. Other embodiments may include surface mount devices with a variety of lead forms, such as gull-wing or J-lead. Within body member 26 the inner portions 16 and 17 of leads 18 and 19 may be interdigitated and exist in a common plane as FIG. 1 illustrates. In other embodiments, however, inner portions, within body member 26, may or may not be interdigitated and existing in a common plane, depending on the bond pad configurations of the die used.

Figure 2:
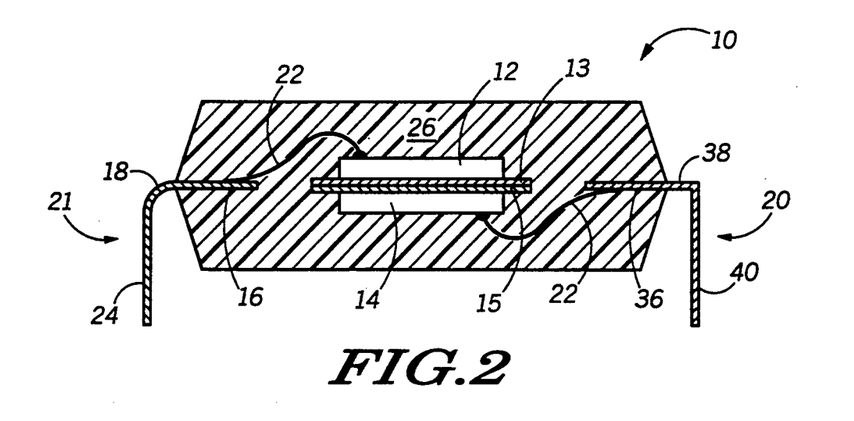
FIG. 2 is a cross-sectional view of the packaged semiconductor device of FIG. 1 taken along the line 2—2.

FIG. 2 illustrates a cross-sectional view of the packaged semiconductor device 10 depicted in FIG. 1 along the line 2—2. Semiconductor die 12 is mounted to flag 13 of leadframe 20 in a face up configuration. Die 14 is similarly mounted to flag 15 of the leadframe 21. Die 12 and 14 and their associated leadframes are then stacked in a back-to-back relationship. In alternate embodiments (not illustrated), the die may be stacked face-to-face or face-to-back. FIG. 2 also shows die 12 and 14 coupled to leadframes 20 and 21, respectively, by connecting inner portions 16 and 36 of leads 18 and 38 to die 12 and 14. Die 12 and 14 are independently coupled to the two leadframes; therefore, each die can be accessed independently from the other. In this embodiment, wire bonds 22 are depicted as the means for coupling the bonding pads on the device die to the inner portions of the leads, but the coupling can be accomplished by other means such as TAB bonds or the like.

Figure 3:
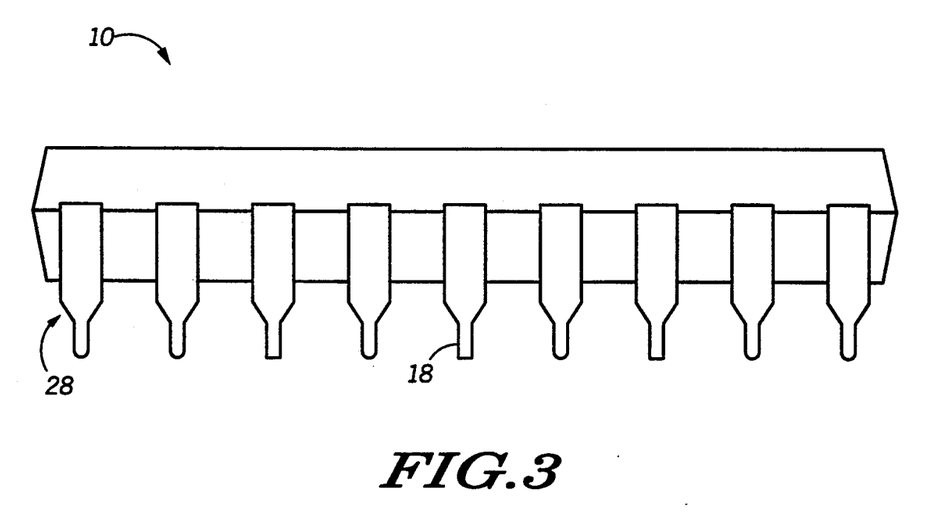
FIG. 3 is a side view of the packaged semiconductor of FIG. 1 and FIG. 2 illustrating the standard package appearance of the invention.

FIG. 2 also illustrates, in accordance with this invention, that the outer portions 24 and 40 of leads of leadframe 20 and 21, respectively, exit the body member 26 in a single plane and are interdigitated. The interdigitated nature of the leads is not apparent in the cross sectional view of FIG. 2, but is shown in FIG. 3 which is a side view of the device 10 illustrated in FIG. 1 and FIG. 2. Again, for purposes of illustration only, the leads of leadframes 20 and 21 are distinguished by rounded ends and straight ends, respectively. Such distinction is only for the purpose of clearly illustrating the invention and would not be a part of the actual device. Rounded leads 28 are mixed among squared leads 18, illustrating that the leads are interditated. As one skilled in the art would recognize, the outside of the packaged semiconductor device 10 in FIG. 3 appears in size and in shape as a standard single component device with a single leadframe, but has the functionality of two or more components.

Figure 4A:
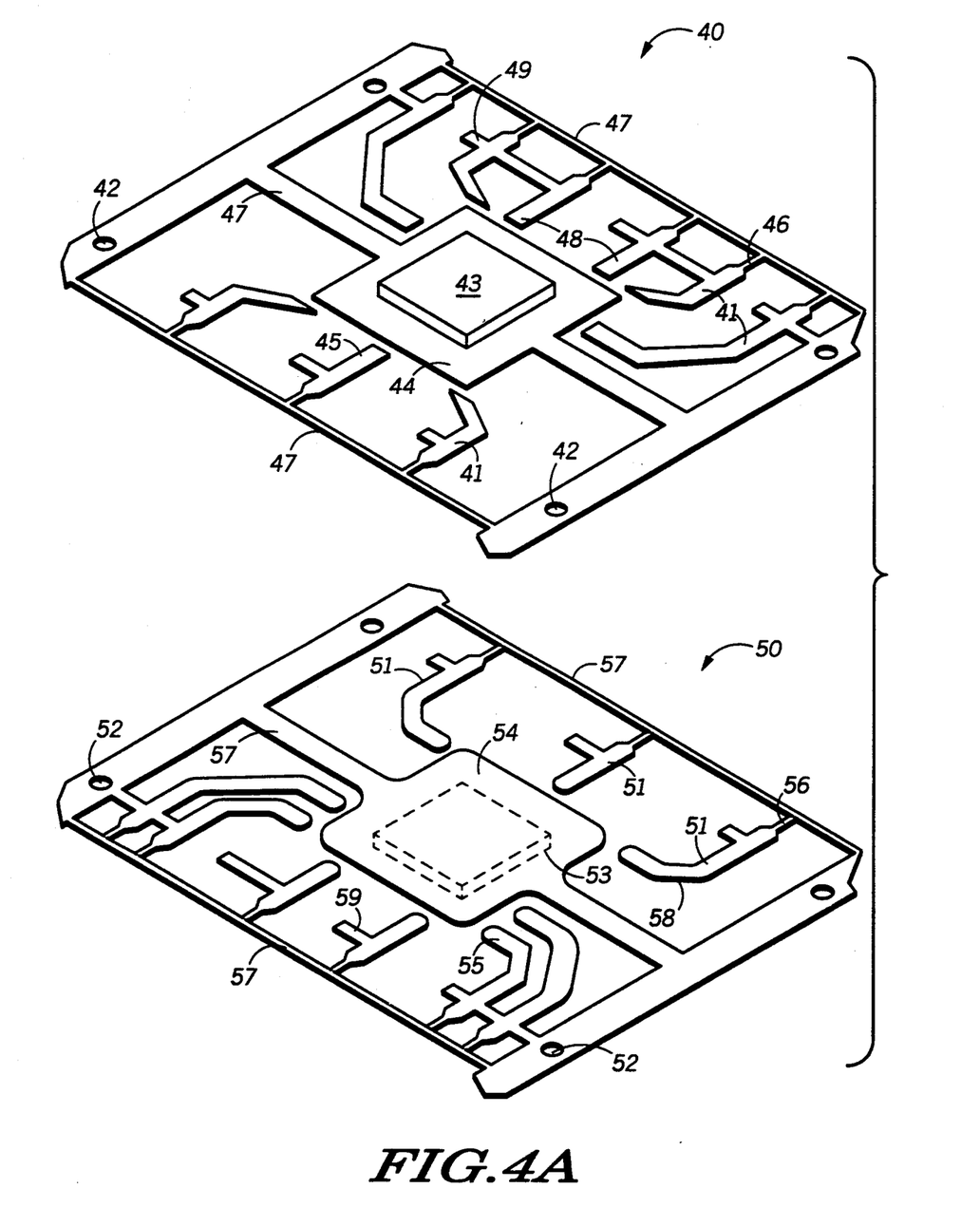
Figure 4B:
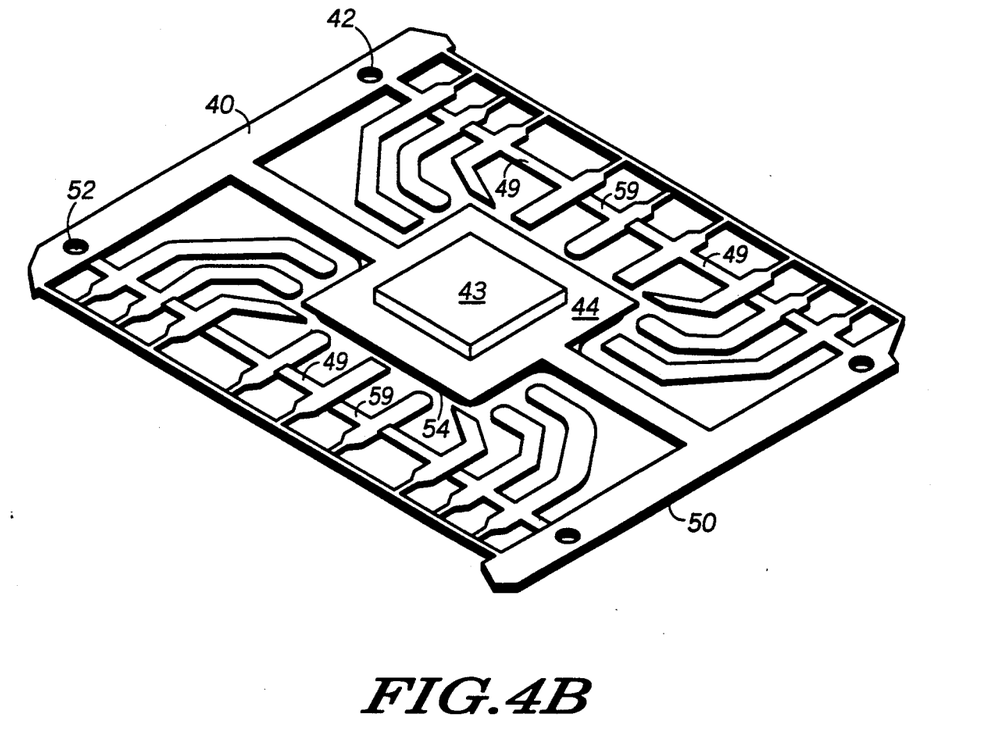

One method, in accordance with the invention, for achieving the preferred embodiment just described is illustrated in FIG. 4A and FIG. 4B. As illustrated in FIG. 4A, die 43 is mounted to and electrically coupled to leadframe 40. Likewise, die 53 is mounted to and electrically coupled to a second leadframe 50. Because die 53 is on the bottom of leadframe 50 and would not be visible in these illustrations, it is shown in ghost. Leadframes 50 and 40, distinguished in FIG. 4A and FIG. 4B by rounded and squared edges, respectively, include leads 41 and 51, flags 44 and 54, respectively, and are typically made from materials such as copper, copper alloys, iron-nickel alloys, or the like. Other materials, such as a TAB tape, could be used in accordance with this invention as well. Die 43 and 53 are mounted to flags 44 and 54, respectively, by use of an opoxy, solder, conductive glass, polyimide, or the like. Electrical coupling of die 43 and 53 to inner portions 45 and 55 of leads 41 and 51, respectively, is achieved by wire bonding, TAB bonding, or the like (not shown). Alignment mechanisms 42 and 52 are also included in the leadframe design in order to assure proper positioning of the leadframes during operations such as die bond or wire bond where alignment is critical. Such mechanisms are generally a pattern of openings in the leadframe material. The openings can be positioned over a sprocket-like apparatus within the die bond or wire bond equipment. The apparatus is used to move the leadframe to the desired location for that operation.

Alignment mechanisms 42 and 52 are also utilized to position one leadframe 40 in relation to the other leadframe 50 such that semiconductor die 43 and 53 are positioned one above the other and such that the outer portions 46 and 56 of leads 41 and 51 are interdigitated. The resulting combination of the properly positioned leadframes is illustrated in FIG. 4B. An advantage of having the leads interdigitated is that the distance from lead to lead, or the pitch, can be minimized on the exterior of the package without requiring the individual leadframes to have a small pitch. Another advantage is that final package outline has a set of leads exiting the package in a single plane as in other standard packaged devices. Although this illustration also shows the inner portions 48 and 58 of leads 41 and 51 to be interdigitated, they may also be otherwise. Likewise, the flags 44 and 54 do not have to be placed exactly one above the other as shown in FIG. 4B, but may be offset to accommodate various die sizes and pin-out configurations.

The stacked leadframes 40 and 50 with semiconductor die 43 and 53 attached and electrically coupled thereto are encapsulated in a protective body member. The type of leadframes illustrated in FIG. 4A and FIG. 4B are generally encapsulated by a plastic molding operation, although body members of other materials, such as ceramics, could be used in accordance with the invention. The molding operation involves placing the stacked leadframes 40 and 50 between two mold platens (not shown) and bringing the platens together, thereby creating a cavity around the semiconductor die and inner portions of the leadframe. The cavity is filled with a molding compound which forms the protective body member. Dam bars are generally incorporated into the leadframe design in order to completely seal the mold cavity and thus prevent leakage of the molding compound from the cavity between the leads of the leadframe. Typically, dam bars are made of the same material as the leadframe and extend continuously from one edge of the leadframe to the other, connecting the associated leads together just outside the outline of the protective body member. To allow the two stacked leadframes 40 and 50 to be interdigitated in a single plane at the edge of the package body, partial dam bars 49 and 59 are used in leadframes 40 and 50, respectively. The partial dam bars 49 and 59 of leadframe 40 and 50 act together to form, in composite, a substantially continuous dam bar extending along the total length of the protective body, as illustrated in FIG. 4B. The partial dam bars do not, in every instance, extend continuously from one lead to the adjacent lead. As illustrated by the semiconductor device of FIG. 1, partial dam bars, such as partial dam bars 49 and 59 of FIG. 4, are removed after encapsulation of the device in a molded package body.

Figure 5:
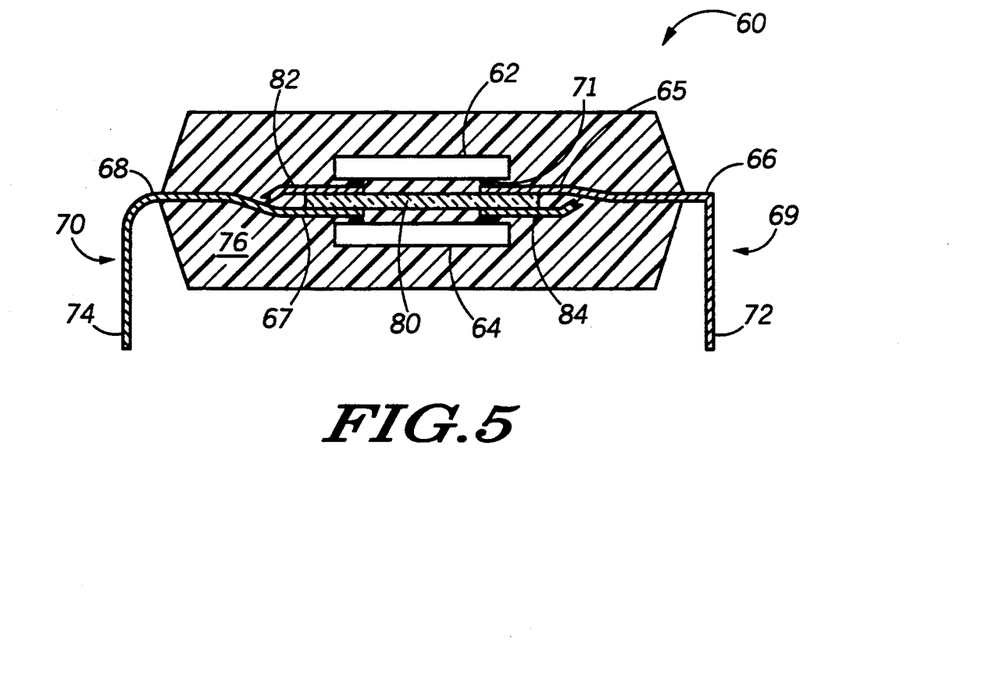
FIG. 5 is a cross-sectional view of a further embodiment of a semiconductor device in accordance with the invention, illustrating the semiconductor die in a face to face relationship, the use of a dielectric material, and the utilization of TAB bonds.

FIG. 5 illustrates, in cross-section, another embodiment of the invention. Packaged semiconductor device 60 includes two semiconductor dies 62 and 64 directly coupled to inner portions 65 and 67 of beam leads 66 and 68, respectively, of two independent leadframes 69 and 70. The leadframes 69 and 70 are further distinguished in the figure with leadframe 69 having squared corners and edges and leadframe 70 having rounded corners and edges. In this embodiment, TAB bonds are used to couple semiconductor die 62 and 64 to leadframes 69 and 70, respectively. One skilled in the art will recognize that the use of TAB bonds may eliminate the need for a flag if the TAB tape is also used as a leadframe, as in FIG. 5. Rather than employing interconnections, such as the wire bonds 20 in FIG. 1 and FIG. 2, between the leadframes 69 and 70 and the semiconductor die 62 and 64, the inner portions 65 and 67 of the leads 66 and 68 are coupled directly to the die 62 and 64 with the employment of a conductive material, such as solder bumps 71. Typically, bumps are fabricated either on the die or on the leads, and coupling can be accomplished by reflowing the bump material.

FIG. 5 also illustrates, in accordance with this embodiment of the invention, that the outer portions 72 and 74 of leads 66 and 68 exit the package body 76 in a single horizontal plane and are interdigitated (The interdigitated nature of the leads cannot be seen in this cross-sectional view). The inner portions 65 and 67 of leads 66 and 68 lie in two different horizontal planes in order to make electrical connections to die 62 and 64, respectively. Inner portions 82 and 84 of two other leads can lie directly above inner portions 65 and 67 of leads 66 and 68, respectively. The outer portions of 82 and 84 are not shown in the figure because they exit the package body 76 in a different vertical plane than that of the cross-sectional figure. As illustrated, the interdigitated outer portions 72 and 74 of leads 66 and 68 of the two leadframes 69 and 70 exit the package in a single plane, but the inner portions 65, 67, 82, and 84 of the two leadframes 69 and 70 may overlap within the package. Accordingly, the invention permits a wide choice in leadframe design and bond pad configuration.

In order to guarantee the electrical isolation of the inner portions 65 and 67 of leads 66 and 68 and the inner portions 82 and 84 of leads not shown, it may be advantageous to use a dielectric material 80, as illustrated in FIG. 5. The dielectric material 80 acts as an electrical isolation between the die 62 and 64, and as an additional support member to the leads 66 and 68 and the die 62 and 64. The size and shape of the dielectric material is dependent on the isolation requirements of the device and the designs of leadframes used. In addition to the use of a dielectric, a heat sink or other heat dissipation mechanism (not shown) which dissipates heat away from the die, toward the exterior of the package may be used.

Figure 6:
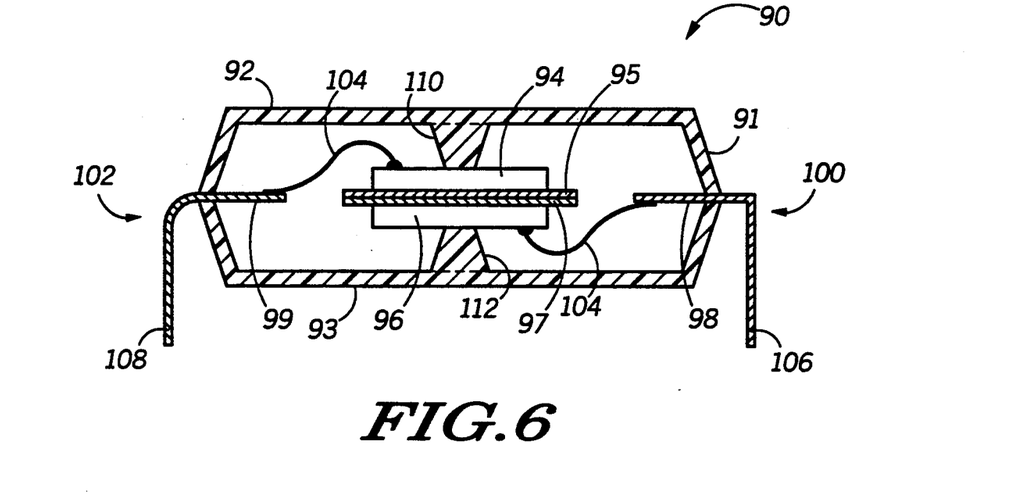
FIG. 6 illustrates another embodiment of the invention such that the components are encapsulated in a cavity package with members which support the semiconductor die.

Yet another embodiment of this invention is shown in FIG. 6, which illustrates the semiconductor device 90 encapsulated in a cavity package 91. As in the previous embodiments, the semiconductor dies 94 and 96 are mounted to flags 95 and 97, respectively, and are electrically coupled to the inner portions 98 and 99 of leads 100 and 102, respectively. Electrical coupling is achieved through the use of wire bonds 104, although coupling may be by another method, such as TAB bonds. The outer portions 106 and 108 of leads 100 and 102, respectively, exit the body member 91 in a single plane and are interdigitated. Body member 91, comprised of upper member 92 and lower member 93, forms a cavity around die 94 and 96, the flags 95 and 97, and the inner portions of the leads 98 and 99. Body members 92 and 93 can be made of typical materials used in semiconductor device packages, such as molding compounds, ceramics, or the like.

Also illustrated in FIG. 6 are optional support members 110 and 112 which are made to be a part of body members 92 and 93, respectively. The primary function of support members 110 and 112 is to eliminate motion of the die, which could cause failure of the electrical connections. Support members 110 and 112 may be of the same material as that of the body members 92 and 93, or may be of a thermally conductive material in order to dissipate heat away from the die surfaces.

Thus it is apparent that there has been provided, in accordance with the invention, a semiconductor device and a process for its fabrication that fully meets the objects and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, leadframe materials other than those mentioned can be used and the number of leadframes used can be greater than two. Leads extending from the package body can take a variety of forms which include gull-wing, J-lead, or the like and packages may utilize through-hole or surface mount technology. Likewise, other encapsulating materials can be used and can include encapsulation directly onto a substrate or PC board, also referred to as "glob top." Therefore, it is intended that this invention encompass all such variations and modifications as fall within the scope of the appended claims.

What is claimed is:

1. A method for fabricating a multichip semiconductor device comprising the steps of:

providing first and second leadframes, each having a plurality of conductive lead members and each lead member of each leadframe having a partial dam bar extending from a side of said lead member;

electrically coupling first and second semiconductor dies to said pluralities of conductive lead members of said first and second leadframes, respectively, said first and second semiconductor dies each having a face surface with active circuitry formed thereon and a back surface opposite said face surface;

positioning said first and second leadframes with said first and second semiconductor dies electrically coupled thereto in a stacked relationship such that said first and second pluralities of conductive lead members of said first and second leadframes are interdigitated and all of said partial dam bars act together to form, in composite, a substantially continuous dam bar; and encapsulating said first and second semiconductor dies and inner portions of all of said conductive lead members in a protective body member such that outer portions of all of said conductive lead members and all of said partial dam bars extend from said package body essentially in a single plane.

2. The method of claim 1 wherein the step of encapsulating said first and second semiconductor dies, and inner portions of all of said conductive lead members comprises encapsulating said first and second semiconductor dies and inner portions of all of said conductive lead members in a molding compound.

3. The method of claim 1 wherein the step of positioning said first and second leadframes with said first and second semiconductor dies attached thereto in a stacked relationship comprises positioning said first and second leadframes with said first and second semiconductor dies attached thereto in a stacked relationship such that said first and second semiconductor dies are positioned in a back-to-back relationship.

4. The method of claim 1 further comprising the step of electrically isolating portions of said first and second leadframes from one another with a dielectric material.

5. A method for fabricating a multichip semiconductor device comprising the steps of:

providing a first leadframe having a first plurality of conductive lead members, each lead member having a first partial dam bar extending from a side of said lead member;

providing a second leadframe having a second plurality of conductive lead members, each lead member having a second partial dam bar extending from a side of said lead member of said second plurality;

electrically coupling first and second semiconductor dies to said first and second leadframes, respectively, said first and second semiconductor dies each having a face surface with active circuitry formed thereon and a back surface opposite said face surface;

positioning said first and second leadframes with said first and second semiconductor dies electrically coupled thereto in a stacked relationship, one above the other, to interdigitate said first and second plurality of conductive lead members and to align said first and second partial dam bars such that said first and second partial dam bars act together to form, in composite, a substantially continuous dam bar;

encapsulating said first and second semiconductor dies, and inner portions of said first and second pluralities of conductive lead members in a protective body member such that said first and second partial dam bars are adjacent and edge of said protective body member and outer portions of said first and second pluralities of conductive lead members extend from said edge of said protective body member essentially in a single plane; and removing said first and second partial dam bars from said first and second pluralities of conductive lead members such that each conductive lead member is electrically independent from all other conductive lead members.

6. The method of claim 5 further comprising the step of electrically isolating portions of said first and second leadframes from one another with a dielectric material.

7. The method of claim 5 further comprising the step of isolating said first and second semiconductor dies from one another with a dielectric material.

8. The method of claim 5 wherein the step of encapsulating said first and second semiconductor dies and inner portions of said first and second pluralities of conductive lead members comprises encapsulating said first and second semiconductor dies, and inner portions of said first and second pluralities of conductive lead members in a molding compound.

9. The method of claim 5 wherein the step of positioning said first and second leadframes comprises positioning first and second leadframes with said first and second semiconductor dies attached thereto in a stacked relationship, one above the other, such that the first and second semiconductor dies are positioned in a back-to-back relationship.

10. A method for fabricating a multichip semiconductor device comprising the steps of:

providing a first leadframe having a first plurality of conductive lead members, each lead member having a first partial dam bar extending from a side of said lead member;

providing a second leadframe having a second plurality of conductive lead members, each lead member having a second partial dam bar extending from a side of said lead member of said second plurality;

electrically coupling first and second semiconductor dies to said first and second pluralities of conductive lead members, respectively, said first and second semiconductor dies each having a face surface with active circuitry formed thereon and a back surface opposite said face surface;

positioning said first leadframe with said first semiconductor die electrically coupled thereto in a mold tool cavity;

positioning a layer of dielectric material overlaying portions of said first leadframe;

positioning said second leadframe with said second semiconductor die with respect to said first leadframe with said first semiconductor die such that said conductive lead members of said second leadframe interdigitate with said conductive lead members of said first leadframe and such that said second partial dam bars act together with said first partial dam bars to form, in composite, a substantially continuous dam bar;

introducing a molding compound into said mold tool cavity to enclose said first and second semiconductor dies and inner portions of said first and second pluralities of conductive lead members in a package body such that said first and second partial dam bars are adjacent an edge of said package body and outer portions of said first and second pluralities of conductive lead members exit from said edge of said package body substantially in a single, common plane; and removing said first and second partial dam bars such that each conductive lead member is electrically independent from all other conductive lead members.

11. The method of claim 10 wherein the step of positioning said first leadframe comprises positioning said first leadframe with said first semiconductor die electrically coupled thereto in a mold tool cavity with said first semiconductor die positioned face down in the mold tool cavity.

12. The method of claim 10 wherein the step of positioning said second leadframe comprises positioning said second leadframe with said second semiconductor die positioned face up with respect to said first leadframe.

* * * * *

UNITED STATES PATENT AND TRADEMARK OFFICE
CERTIFICATE OF CORRECTION

PATENT NO. : 5,147,815
DATED : 9/15/92
INVENTOR(S) : James J. Casto

It is certified that error appears in the above-identified patent and that said Letters Patent is hereby corrected as shown below:

Column 8,
In claim 5, line 33, after "adjacent", delete -- and -- and add -- an --.

Signed and Sealed this

Twenty-sixth Day of October, 1993

Attest:

BRUCE LEHMAN

*Attesting Officer*     *Commissioner of Patents and Trademarks*